United States Patent [19]
Goodrich, Jr. et al.

[11] 3,971,499
[45] July 27, 1976

[54] BONDING TOOL

[75] Inventors: George E. Goodrich, Jr., San Carlos; Earl S. Cain, Portola Valley; George E. Goodrich, Sr., San Carlos; Denis Keith Gilding, Mountain View; Jerome A. Carlson, Woodside, all of Calif.

[73] Assignee: Tribotech, Redwood City, Calif.

[22] Filed: Sept. 3, 1974

[21] Appl. No.: 502,560

[52] U.S. Cl. ............................................... 228/54
[51] Int. Cl.² .......................................... B23K 31/02
[58] Field of Search ................ 228/1, 51, 52, 53, 54

[56] References Cited
UNITED STATES PATENTS

| | | | |
|---|---|---|---|
| 3,627,192 | 12/1971 | Killingsworth | 228/1 X |
| 3,690,538 | 9/1972 | Gaiser | 228/1 X |

*Primary Examiner*—Al Lawrence Smith
*Assistant Examiner*—Margaret Joyce
*Attorney, Agent, or Firm*—Flehr, Hohbach, Test, Albritton & Herbert

[57] ABSTRACT

A bonding wedge for joining or bonding wire leads to contact areas or elements in the semiconductor and electronic industry including a rectangular wire guiding hole extending therethrough cooperating with a positioning groove formed on the bonding tip.

13 Claims, 21 Drawing Figures

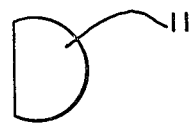
FIG.—1
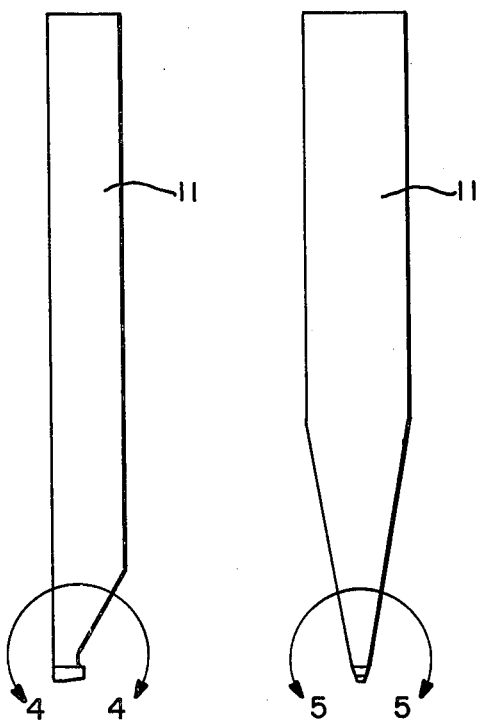
FIG.—2  FIG.—3
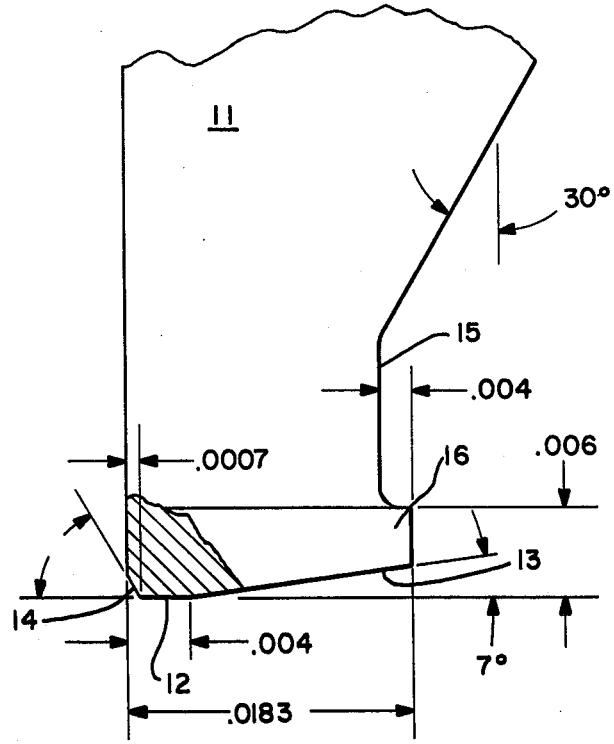
FIG.—4
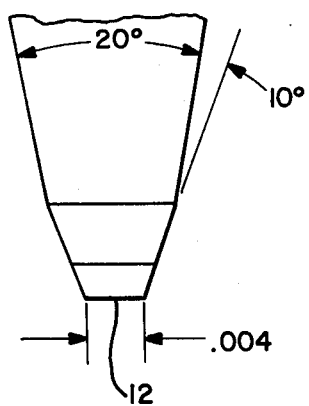
FIG.—5

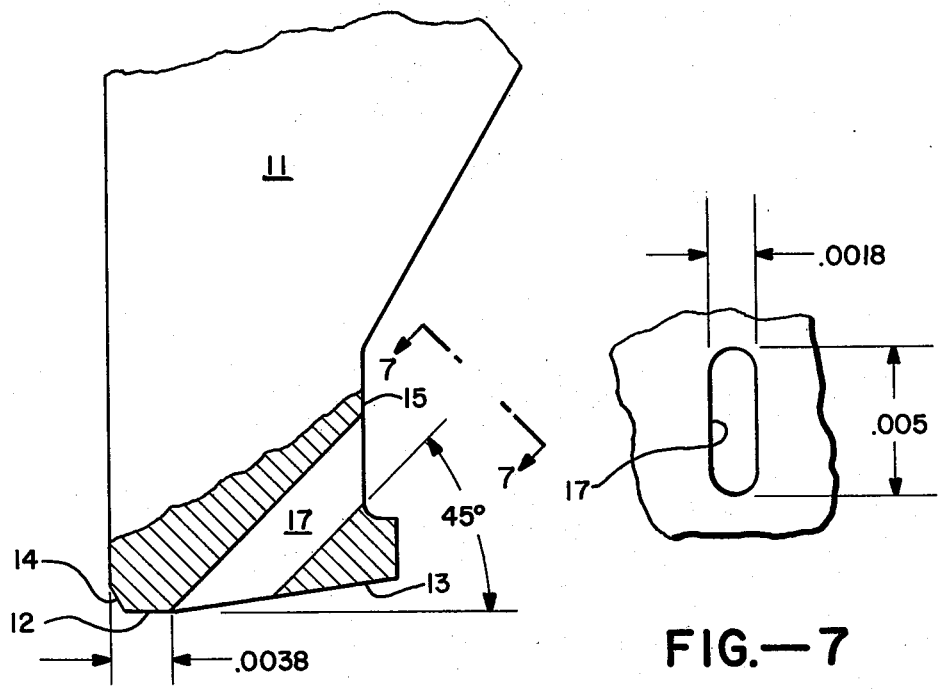
FIG.—6
FIG.—7
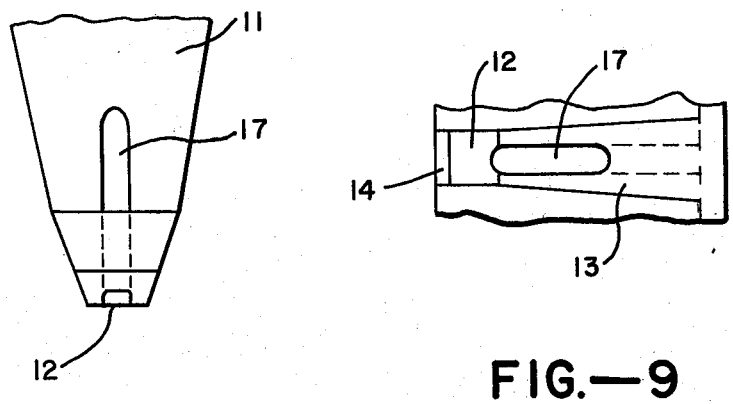
FIG.—8
FIG.—9

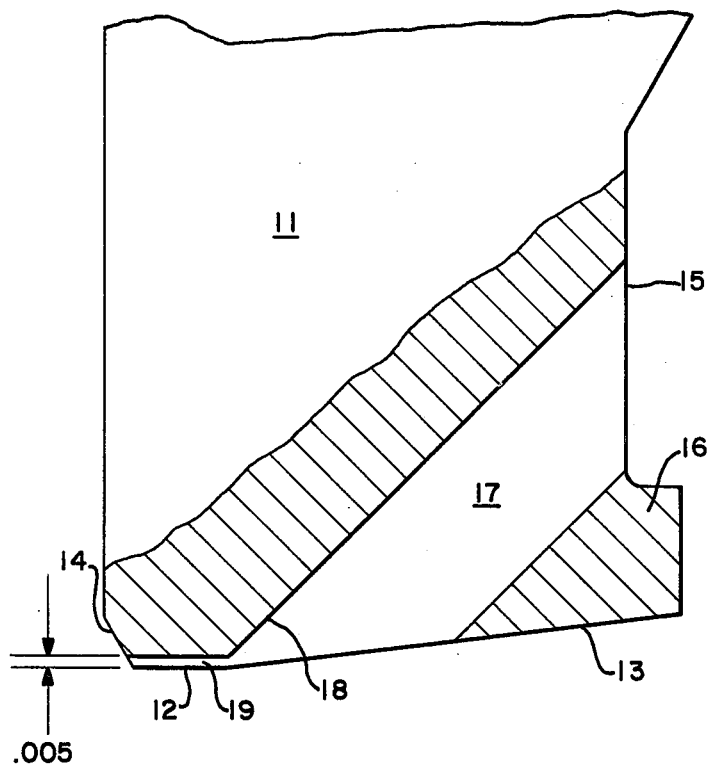
FIG.—10
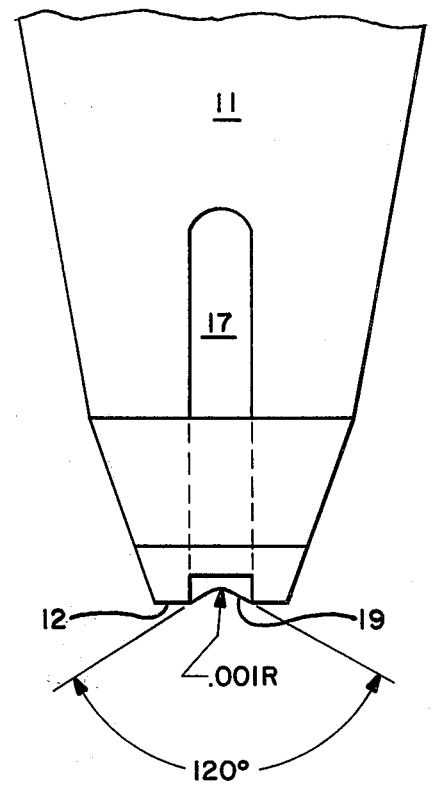
FIG.—11
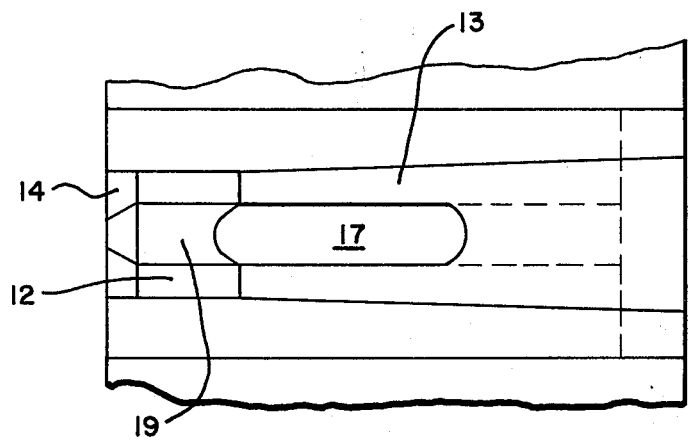
FIG.—12

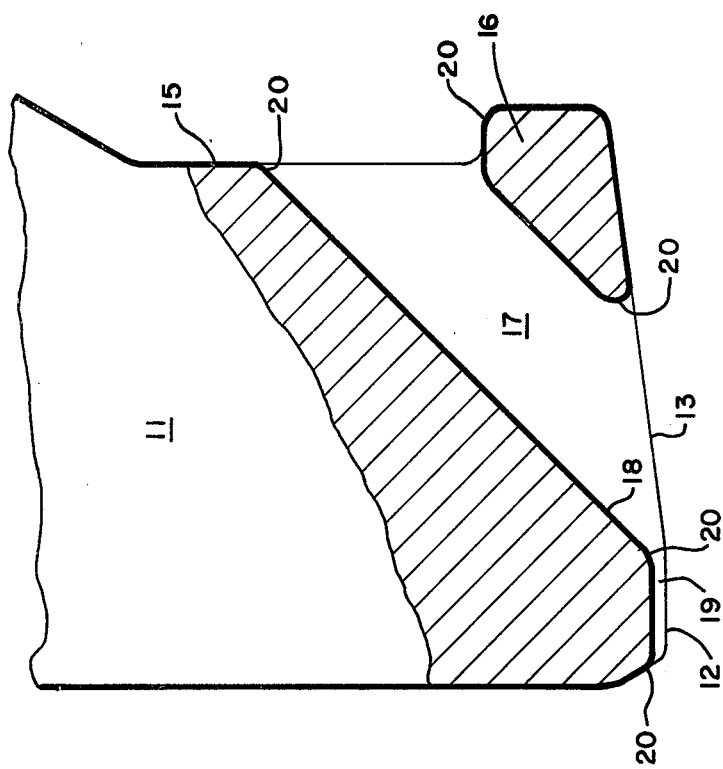
FIG.—15
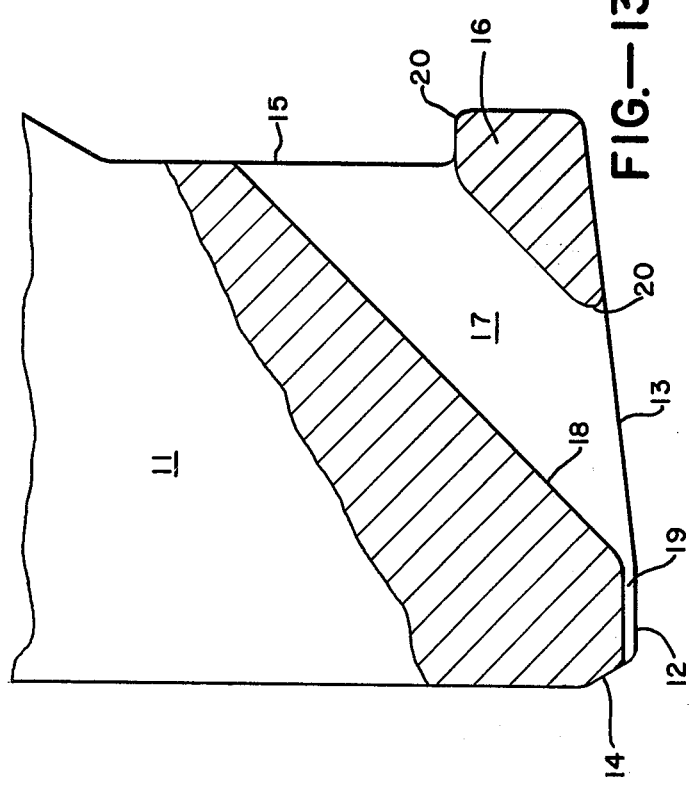
FIG.—13
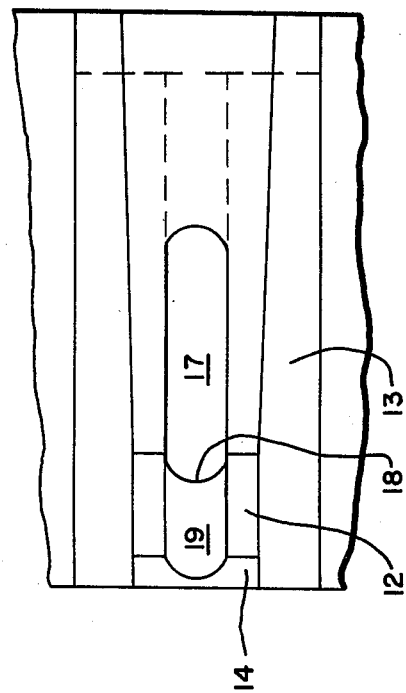
FIG.—14

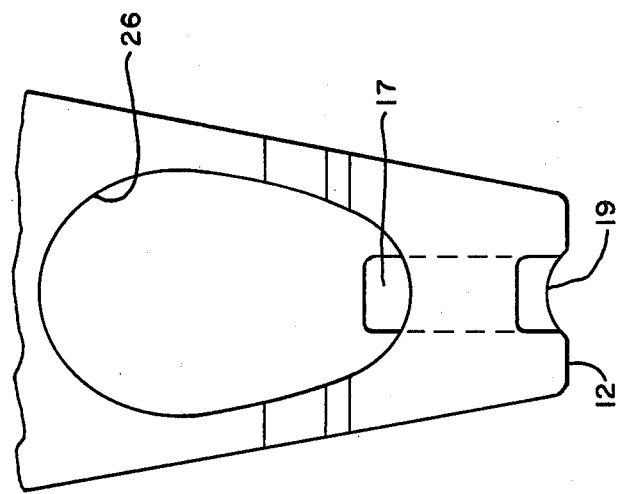
FIG.—17
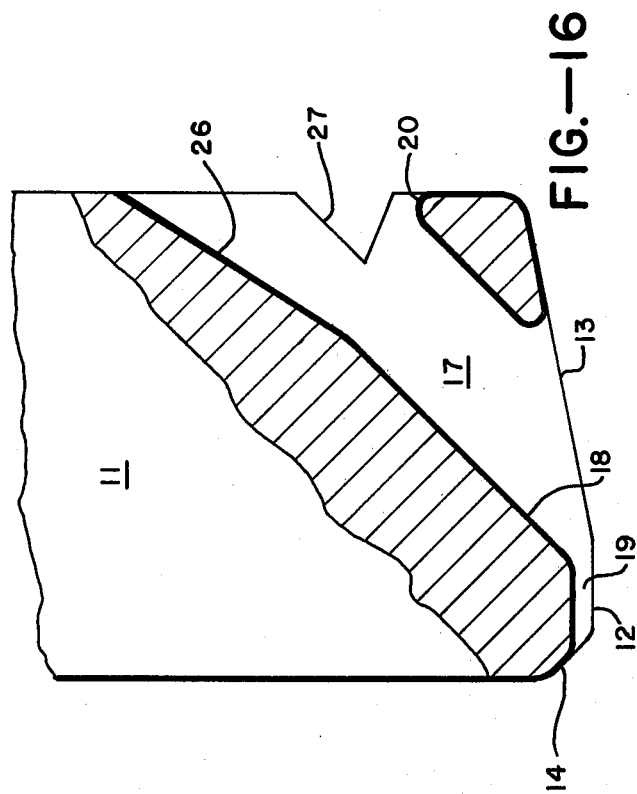
FIG.—16
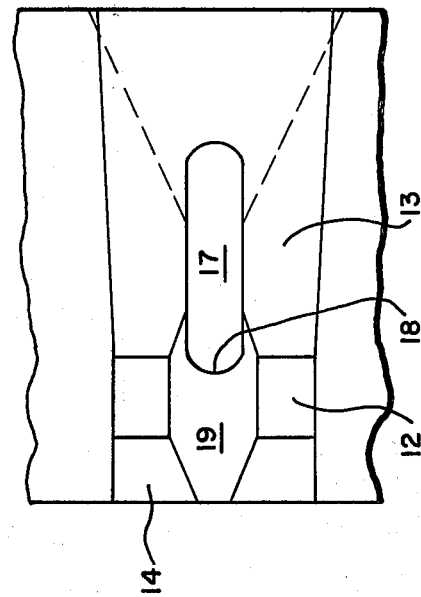
FIG.—18

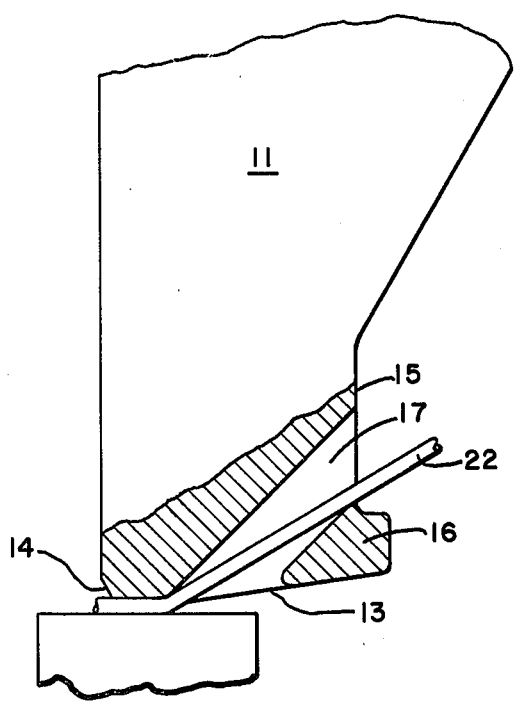
FIG.—19
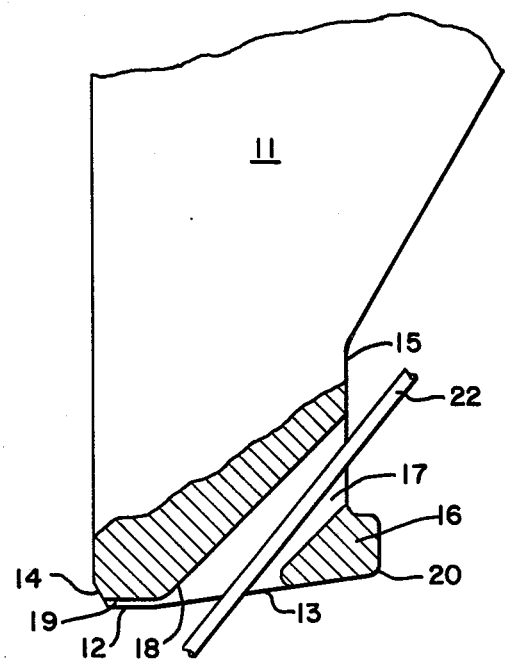
FIG.—20
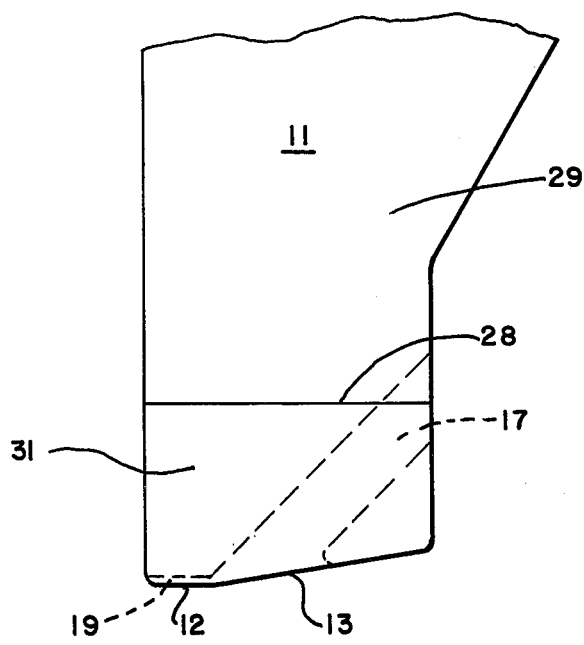
FIG.—21

BONDING TOOL

BACKGROUND OF THE INVENTION

This invention relates generally to wire bonding tools for use in the semiconductor and electronic industry and more particularly to wire bonding wedges.

In U.S. Pat. No. 3,627,192, owned by the assignee of this application, there is described a wire bonding tool of the capillary or wedge type including a shank of a material having a high modulus of elasticity such as tungsten carbide with one end portion forming a welding tip. A wire guiding hole presents the wire to be bonded to the tip. The end portion of the tool is made of osmium to provide an improved bond and increased tool life. Other bonding wedges of various shapes and designs are known.

One of the difficulties experienced with the wire bonding wedges of the prior art is that the guide opening is generally cylindrical and only slightly larger than the wire to be bonded. The build-up of dirt and other debris tends to easily plug the hole and strain the wire. Furthermore, the width of the tip, in order to accommodate an opening of predetermined cross-sectional area, is large. This interferes with viewing of the bonding area by the operator.

When the bonding wedge is lifted and translated after a bond, there tends to be abrasion of the wire because of the change in angle of the wire with respect to the horizontal.

Since bonding tools are relatively small, it is difficult to thread the wire through the guide opening. In the past, the end of the opening has been enlarged in the form of a cone to thereby present a larger insertion area for the thin wire lead material.

In summary, prior art tool tips have been wider than desired, guide holes are subject to plugging, tend to abrade the wire, and fail to control the wire in feeding up the bonding pads.

OBJECTS AND SUMMARY OF THE INVENTION

It is a general object of the present invention to provide an improved bonding wedge.

It is another object of the present invention to provide a method of manufacturing an improved bonding wedge.

It is still another object of the present invention to provide a bonding wedge particularly useful in aluminum wire ultrasonic bonding.

It is a further object of the present invention to provide an improved bonding tool of the wedge type in which the bonding wire can be fed at various angles with respect to the horizontal permitting universality of application and bonding machine appurtenances.

It is a further object of the present invention to provide a bonding tool which includes a rectangular guide opening with a large vertical height and narrow horizontal width to provide precise, accurate and continuous guiding of the wire to precisely the center of the bonding tip. This enhances accuracy of the bond wire location on customer circuit bonding pads permitting the circuit pads to be of minimum size while providing improved space to a round wire in the slot.

It is a further object of the present invention to provide a wire bonding wedge which permits application of the bonding wedge in all types of packages including deep packages where the wire for reason of accessibility to the circuit chip is presented to the bonding surface at relatively steep angles from the horizontal and which also permits the use of wire fed at relatively low angles from the horizontal, which features are not currently available for round wire bonding.

It is a further object of the present invention to provide a round wire bonding tool with a rectangular vertical hole which provides an increased area where dirt and other debris can accumulate without detriment to the function of guiding or feeding the wire.

It is a further object of the present invention to provide a wire bonding tool in which the bonding tip pad is grooved to provide a subsequent guide for the wire and to which a rectangular hole presents the wire.

It is a further object of the present invention to provide a bonding tool which includes means for facilitating the insertion of the bonding wire into the guide opening.

It is a further object of the present invention to provide a wire bonding tool having a rectangular opening with a long exit length at the rear of the bonding pad to provide for reduced stresses in bonding wire when the tool is raised from a first bond to loop height prior to movement to make the second bond and lowering from loop height and positioning the second bond.

It is a further object of the present invention to provide a bonding tool having rounded edges on all contact points with the bonding wire to reduce frictional drag, wear and stress during the various looping and wire feeding operations.

It is a further object of the invention to provide a bonding tool suitable for ultrasonic wedge bonding and thermal compression wedge bonding.

The foregoing and other objects of the invention are achieved by a bonding tool in which the wire guiding hole is rectangular rin traverse section with large vertical and small horizontal dimensions and which opens to the tip of the wire bonding tool which may be grooved to further guide the wire onto the associated pad. The tool may be plated to form an osmium coating or layer on the surface to provide for increased wear and gripping characteristics. The tool may also be coated with an anti-metallic wetting thin layer to permit use of the tool in connection with aluminum alloy wire.

BRIEF DESCRIPTION OF THE DRAWING

FIG. 1 is a top view of the blank used in constructing a bonding wedge in accordance with the present invention.

FIG. 2 is a side elevational view of the blank.

FIG. 3 is a rear elevational view of the blank.

FIG. 4 is an enlarged view of the tip end of the blank shown in FIG. 2 taken generally along the line 4—4.

FIG. 5 is an enlarged view of the end of the blank shown in FIG. 3 taken generally along the line 5—5.

FIG. 6 is a side elevational view of the end of the bonding wedge after it has been machined to form a rectangular guide hole.

FIG. 7 is a partial view taken along the line 7—7 of FIG. 6 showing the rectangular guide hole.

FIG. 8 is a rear view of the tip portion showing the rectangular hole extending to the rear of the tool.

FIG. 9 is a bottom view of the end of the wedge showing the rectangular hole cooperating with the tip.

FIG. 10 is an enlarged view of the bonding tip showing a guide groove formed in the tip.

FIG. 11 is a rear elevational view showing the groove formed in the tips.

FIG. 12 is a bottom view of the bonding wedge shown in FIGS. 10 and 11.

FIG. 13 shows the bonding wedge of FIG. 10 after it has been etched to relieve sharp edges.

FIG. 14 is a bottom view of the wedge shown in FIG. 13.

FIG. 15 is a side elevational view in section of the bonding wedge after it has been osmium plated to form a thin layer of osmium on the exposed surfaces of the tip.

FIG. 16 is a side elevational view of another embodiment of the tip of the bonding wedge with the rectangular opening having an enlarged rear end.

FIG. 17 is a rear elevational view of the tip shown in FIG. 16.

FIG. 18 is a bottom view of the tip shown in FIG. 16.

FIG. 19 is a side elevational view of a wedge tip, partly broken away, showing the wire being fed at a small angle with respect to the horizontal.

FIG. 20 is a side elevational view of a wedge tip, partly broken away, showing the wire being fed at a relatively steep angle with respect to the horizontal.

FIG. 21 is a side elevational view showing another means for locating the end of the guide opening.

DESCRIPTION OF PREFERRED EMBODIMENTS

FIGS. 1, 2 and 3 show a typical blank 11 which may be employed in the manufacture of a bonding wedge. The blank 11 is preferably made of a material having a high modulus of elasticity whereby to effectively transmit rather than absorb ultrasonic or mechanical energy. The blank transmits ultrasonic or mechanical energy from a bonding machine to the bonding tip. The blank may be made of a carbide such as titanium tungsten, tantalum and silicon carbide; we have found tungsten carbide to be generally suitable while hardened steel will be satisfactory in some applications. Generally, bonding tips are rather minute and typical dimensions of the blank are shown on the figures. Dimensions and angles are shown in various other of the figures to provide an indication of the relative size, proportion and angle of the elements of the bonding tool.

FIGS. 4 and 5 show an enlarged side and rear elevational view of the bonding end of the tool. It is noted that the tool is tapered towards the end at one taper angle and then beveled at an increased angle to form a narrow end. The end is machined at an angle to provide a bonding tip 12 with a back relief portion 13. The front edge of the tool is beveled as indicated at 14. The narrow tip permits good viewing of the bond by an operator. The rear of the tool is recessed at 15 to provide a protruding portion 16 which, as presently will be described, is one means of aiding in threading the wire.

In contrast to a round wire guide hole for guiding the wire from the rear of the tool to the bonding tip 12, there is formed a narrow rectangular wire guide or slot opening 17 which in transverse section is relatively narrow in comparison to its height whereby to permit the relatively narrow tip. The other advantage of having a rectangular slot will become apparent but generally it is to provide for entrance of the wire at various angles without abrasion and reduce plugging by dirt and debris. The hole 17 may be formed in the carbide blank by means of an electrical discharge machine. The upper edge 18 of the hole extends to the bonding tip surface 12, intersecting the tip pad at the commonly referred to back radius which creases the wire for breaking the wire in preparation for the next bond pair. FIGS. 7, 8 and 9 show various views of the bonding tip and the rectangular opening.

Thereafter, a groove 19, FIG. 10, is machined in the bonding tip to provide a wire guiding and retaining groove. The groove may be "V" shaped, oval or rectangular in section. It is seen that there are relatively sharp edges at the various parts of the tool as machined. In order to relieve sharp edges and smooth out irregularities, the tool is etched by electrochemical etching, for example, by placing the tool in an etching solution comprising 17% $H_2SO_4$ and 83% MeOH for a period of 5 seconds to a minute with 5 to 20 volts applied to the tool. The etching serves to round the very sharp corners and provides smooth corners and surfaces such as shown at 20 in FIGS. 13 and 14. It is seen that the tool has an improved configuration in that the sharp edges are now rounded to decrease wire abrasion and to provide smooth feeding. The wire may be easily threaded into the tool because of the relief notch 15 and protruding back portion 16 whereby one can easily view the rear of the tool from the side and insert the wire downwardly through the opening. The wire then extends outwardly and as the tool comes down, it becomes aligned in cooperation with the groove 19.

Reference is particularly made to FIGS. 19 and 20 which show a wire 22 extending through the rectangular slot, bearing upon the rounded edges 20, and into the groove and in cooperation with a contact pad. It is seen that the wire is at a relatively small angle with respect to the horizontal. FIG. 20 shows the tool as it is being lifted and showing the wire 21 at an acute angle and still not binding on any of the surfaces. Thus, the rectangular slot guides the wires laterally while leaving it relatively free vertically.

The groove and guide prevent skewing off of the bonding wire if the second bond axis is not coincident with the first bond axis. The capability of having the wire fed at various angles to the pad permits use of the bonding wedge for packages of various depth or bonding machines with various ultrasonic feed holes and wire clamp positions.

Although the bonding wedge design described above offers unique advantages over prior art tool designs, an additional advantage can result from the use of an osmium metal layer formed on the exposed surfaces at the tip of the tool, namely, the surfaces of the hole and bonding groove. The osmium coating provides increased gripping of the wire and increased wear of the tool. The life of the tool can be increased several times above typical carbide tools. After the tool has been machined and etched, FIG. 13, the tool is cleaned by anodically etching, for example, at 3 volts for 30 seconds in a 3% caustic soda and washed in methanol. Thereafter, the tip of the tool is plated with osmium. The plating solution can be made by dissolving 0.5 grams of sodium metal in 5 mls of methanol, weighing out 0.25 grams osmic acid, dissolving the osmic acid in a sodium/methanol until the solution becomes straw to orange color, then adding 50 mls of dimethylformamide solution whereby the solution becomes blue/green. The cleaned parts are placed in the plating solution made as described above and, for example, 2 volts d.c. are applied to the anode thereto with 0 volts applied to the rack. They are immersed in the solution for between 2 and 10 hours to form a plated osmium surface. The current is turned off, and the parts are washed in distilled water. The plated osmium coating is preferably between 0.0002 and 0.001 inches. The tool is then preferably electro-polished with 17% $H_2SO_4$, 3% methanol and 3 to 5 drops of 52% HF with a voltage of, for example, 3 volts applied between the tool and the rack.

More details of one method of plating osmium are set forth in copending application Ser. No. 502,537, filed Sept. 3, 1974. The coating is schematically shown by the dark line of FIG. 15. It is observed that the plating coats all the lower surfaces of the tip including the guide opening and bonding groove.

Where the tool is employed for ultrasonic aluminum wire bonding, it is preferably treated with a silane solution whereby to form a thin silicone layer on the surface of the tool. The thin layer has been found to prevent adhesion of aluminum and other particles to the tool and serves to smooth the surfaces which guide the bonding wire.

FIGS. 16, 17 and 18 show a tool of slightly different design incorporating essentially the same design features. The end of the tool does not include a notched portion. Rather, the rear end of the rectangular opening cooperates with a conical opening 26. This provides a large area for insertion of the bonding wire to ease threading. In addition, the rear may be notched 27 to mark the location of the opening when viewing the wedge from the side. In other respects the tool is the same as previously described and bears like reference numerals.

FIG. 21 shows a modification of a bonding tool where the location of the center of the hole 17 is identified by the line 28 between the tool taper 29 and tool bevel 31.

Thus, it seen that there has been provided an ultrasonic bonding wedge of improved design. The tool design permits feeding wire over a wide range of angles with respect to the horizontal, reduces wire abrasion, minimizes plugging by debris and dirt, facilates threading and provides a good view of the bonding surface.

We claim:

1. In a bonding tool having a shank and a tapered work end including a narrow bonding tip for holding a wire against a surface to which it is to be bonded, the improvement comprising: a rectangular wire guide opening, which in transverse section is of relatively narrow width and large height, extending through the work end from the rear of the tool to a position adjacent to the bonding tip, whereby bonding wire can be fed and guided from the rear of the tool to the bonding tip over a variety of different angles.

2. A bonding tool as in claim 1 in which said work end includes a relief extending upwardly and rearwardly from said bonding tip to permit tilting of the tool to crease the wire for breaking.

3. A bonding tool as in claim 1 in which the tool includes means for indicating the position of the opening.

4. A bonding tool as in claim 1 further including a protrusion adjacent to one edge of the opening at the rear end portion of the tool to serve as a guide in threading wire into the opening.

5. A bonding tool as in claim 3 wherein said means for indicating the position of the opening includes a notch formed at the rear of the tool.

6. A bonding tool as in claim 1 wherein the work end of the tool includes an osmium coating covering the surfaces of the bonding tip and rectangular wire guide opening.

7. A bonding tool as in claim 6 in which said work end is further coated with a thin layer of silicone.

8. A bonding tool as in claim 1 in which said tip includes a longitudinal groove for receiving and positioning the wire extending through said rectangular opening.

9. The bonding tool of claim 1 wherein one side of the work end is tapered and beveled to form a line generally aligned with the end of the guide opening at the rear of the tool, said line serving to indicate the position of the opening.

10. The bonding tool of claim 1 wherein the corner at the junction of the tip and the wire guide opening is rounded.

11. The bonding tool of claim 1 wherein the corners formed at the junctions of adjacent surfaces of the work end are rounded.

12. The bonding tool of claim 1 wherein the corners at the ends of the rectangular wire guide opening are rounded to facilitate smooth feeding of the wire.

13. In a bonding tool having a shank and a tapered word end including a narrow bonding tip for holding a wire against a surface to which it is to be bonded, the improvement comprising: a silane coated wire opening of narrow high rectangular transverse section extending through the work end from the rear of the tool to a position adjacent to the bonding tip whereby bonding wire can be fed and guided from the rear of the tool to the bonding tip with minimum plugging due to debris and low abrasion regardless of wire position.

* * * * *